(12) United States Patent
Udo

(10) Patent No.: US 6,515,733 B1
(45) Date of Patent: Feb. 4, 2003

(54) PATTERN EXPOSURE APPARATUS FOR TRANSFERRING CIRCUIT PATTERN ON SEMICONDUCTOR WAFER AND PATTERN EXPOSURE METHOD

(75) Inventor: Yuso Udo, Chofu (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 151 days.

(21) Appl. No.: 09/605,897

(22) Filed: Jun. 29, 2000

(30) Foreign Application Priority Data

Jun. 30, 1999 (JP) .......................................... 11-187029

(51) Int. Cl.[7] ........................ G03B 27/42; G03B 27/52; G03B 27/32
(52) U.S. Cl. .............................. 355/53; 355/55; 355/77
(58) Field of Search .............................. 355/52, 53, 55, 355/67, 77; 356/399–401; 250/548, 398

(56) References Cited

U.S. PATENT DOCUMENTS

| 5,690,785 A | | 11/1997 | Nakaya .................... 156/626.1 |
| H1774 H | * | 1/1999 | Miyachi ....................... 355/67 |
| 6,118,515 A | * | 9/2000 | Wakamoto et al. ........... 355/53 |
| 6,208,407 B1 | * | 3/2001 | Loopstra ...................... 355/53 |

FOREIGN PATENT DOCUMENTS

| JP | 3275368 | 4/2002 |
| JP | 3275879 | 4/2002 |

* cited by examiner

Primary Examiner—Henry Hung Nguyen
(74) Attorney, Agent, or Firm—Oblon, Spivak, McClelland, Maier & Neustadt, P.C.

(57) ABSTRACT

A semiconductor wafer having an effective chip region set within an effective element region in which an element is formed and required for forming a single chip and an ineffective chip region which includes an ineffective element region in which no element is formed and required for forming a single chip. A degree of unevenness of a surface of the semiconductor wafer is measured at a plurality of sites within a predetermined region by an unevenness measuring section by applying light thereof, so that unevenness data are output. The predetermined region includes either or a part of both of the effective chip region and the ineffective chip region. A reference plane to which light is applied is determined by using only unevenness data of the effective chip region after unevenness data of the ineffective chip region are eliminated from the unevenness data. Inclination of the semiconductor wafer is controlled in accordance with the reference plane obtained through the calculation performed by the calculating section.

16 Claims, 4 Drawing Sheets

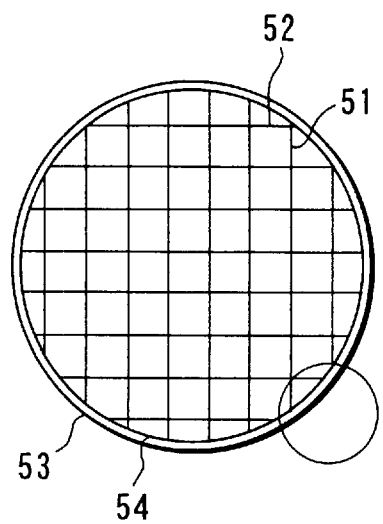
FIG. 1A
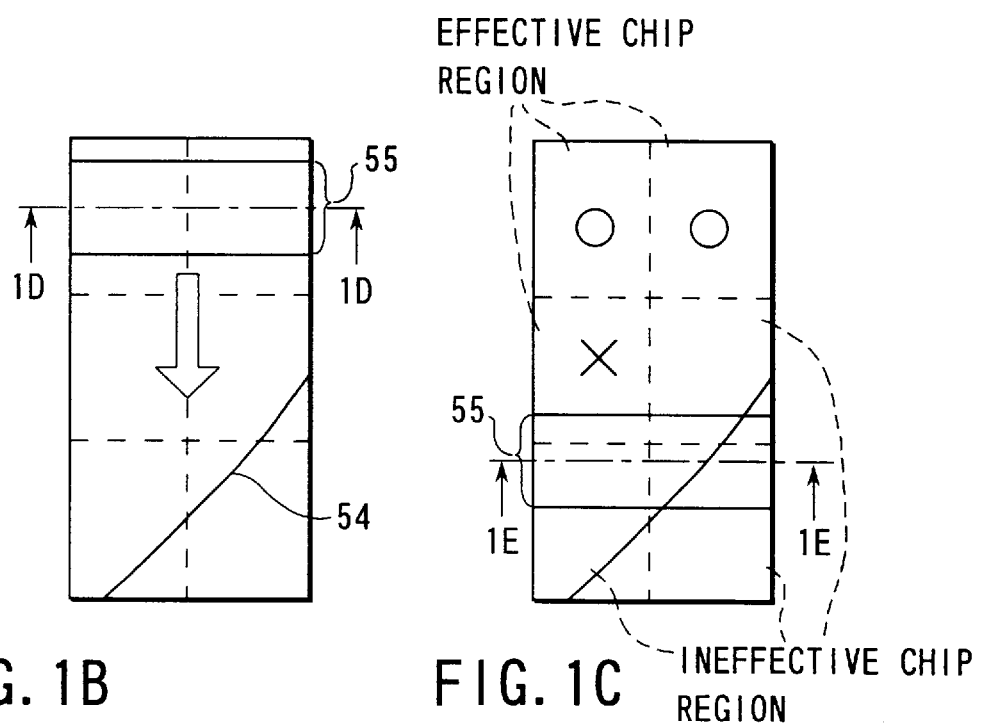
FIG. 1B
FIG. 1C
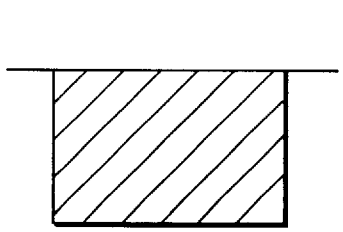
FIG. 1D
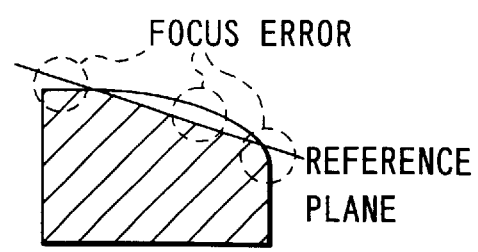
FIG. 1E

PATTERN EXPOSURE APPARATUS FOR TRANSFERRING CIRCUIT PATTERN ON SEMICONDUCTOR WAFER AND PATTERN EXPOSURE METHOD

CROSS-REFERENCE TO RELATED APPLICATIONS

This application is based upon and claims the benefit of priority from the prior Japanese Patent Application No. 11-187029, filed Jun. 30, 1999, the entire contents of which are incorporated herein by reference.

BACKGROUND OF THE INVENTION

The present invention relates to a pattern exposure apparatus and method for use in transferring a circuit pattern of a mask to a semiconductor wafer in manufacturing a semiconductor device, and more particularly, an apparatus and method for controlling the surface of the semiconductor wafer on which light is applied, by tilting the semiconductor wafer.

When a semiconductor element is formed on a semiconductor wafer by a conventional method, a so-called light-exposure step is usually employed. In the light exposure step, a circuit pattern drawn on a reticle is projected onto the wafer by a light exposure apparatus called a stepper and thereby reduced and transferred onto the wafer.

In the light exposure step, the circuit pattern of a single chip or a plurality of chips are transferred to a predetermined portion of the pattern formation region of a semiconductor wafer in a first light exposure step. Subsequently, a second light-exposure step is performed, in which another circuit pattern of a single chip or a plurality of chips are transferred to an adjacent part by moving the light exposure apparatus. If the light exposure process mentioned above is repeated a plurality of times while moving the light-exposure position, the entire circuit pattern is transferred to the pattern formation region of the semiconductor wafer.

In this light exposure step, if the surface of the semiconductor wafer is not flat but significantly uneven, the distance between a lens of the pattern exposure apparatus and a light-receiving surface of the wafer varies from part to part. If the variance in distance exceeds a certain limitation, a so-called out-of-focus image is formed. As a result, a transfer pattern becomes blurred. The range of the distance within which no blurred image is formed, is called "the depth of focus" D. There is the following relationship between the depth of focus D, resolution R, an aperture ratio (N/A) of the lens of the stepper, and wavelength λ of a light source:

$$R = K1 \times \lambda / (NA) \quad (1)$$

$$D = K2 \times \lambda / (NA) \quad (2)$$

where K1, K2 are constants.

The resolution R in the aforementioned equation (1) corresponds to a minimum drawing width. The resolution R has been reduced as the semiconductor devices are integrated. To reduce the resolution R, the wavelength of the light source must be reduced. As a result, the depth of focus D is reduced. Since the depth of focus D is reduced, the surface of the wafer is required to be formed much flatter.

Therefore, a mechanism is devised to cope with the case where the degree of flatness of the wafer surface is low. The mechanism is a leveling function and used by setting it in the stepper. More specifically, leveling is made by setting a light-exposure reference plane on the wafer so as to minimize the variation in distance between the lens of the light exposure apparatus and sites of the light-receiving surface of the wafer (said variation is ascribed to the unevenness of the surface) in the region to be exposed to light at one time, and tilting the wafer such that the light-exposure reference plane matches with a light focus plane.

Recently, semiconductor devices have been integrated more and more. The integration of the semiconductor devices is attained by not only reducing the minimum drawing width but also increasing a chip size. This fact means that smaller images requiring low resolutions have to be drawn onto a larger area. To attain this, it is necessary to use a lens having a larger aperture and a smaller aberration. As a result, a higher cost is required not only to design the stepper lens system but also to fabricate the stepper employing such a lens system.

There is another system called "scan light exposure system". In this system, the entire pattern drawn on the reticle is not transferred to the wafer at one time. Instead, a part of the pattern on the reticle is scanned from one end to the other end and transferred while the wafer is moved. The scan light exposure system has the following advantages. First, a large-size lens is not set in the stepper. Since the area to be exposed at one time (called "unit exposure area") can be reduced, even if the wafer has an uneven surface, the uneven surface will not have a large effect upon transferring of the pattern. This means that the transferring pattern according to this system is the same as when the pattern is transferred to a substantially flat wafer surface.

When a wafer is manufactured, the surface of the wafer is usually polished with a polishing agent such as a colloidal silica to form a mirror surface. More specifically, the wafer surface is placed on a polishing cloth (urethane or nonwoven cloth), and is swung and rotated while the wafer surface is pressurized. In this step, since weight is applied onto the wafer, the wafer is more or less sunk into the polishing cloth. The peripheral portion of a wafer edge is brought into contact with the polishing cloth at an angle. As a result, the edge of the peripheral portion of the wafer is selectively polished and rounded off. Therefore, the "rounded off portion" is inevitably formed in the peripheral portion of the wafer edge.

Since the "rounded off portion" is present, the flatness of the surface is significantly reduced on the peripheral portion. Therefore, it becomes very difficult to level the wafer surface of the peripheral portion in order to reduce the degree of the roughness of the surface, during the light exposure step. To explain in other words, leveling (tilting the wafer) is not performed regularly, with the result that a leveling error occurs more frequently.

There is another advantage of the scan light-exposure stepper. If a chip size is smaller than the area exposed to light from the stepper at one time, a plurality of chips can be simultaneously exposed to the light. Therefore, the time required for applying light to the entire surface of a wafer can be reduced. Since a light-exposure unit area is small, the light-exposure reference plane is more easily performed in accordance with the degree of roughness of the wafer surface.

Problems occur when a circuit pattern is transferred to the region including a peripheral portion of the wafer edge. We will now explain the problems with reference to FIG. 1A to FIG. 1E.

FIG. 1A is a plan view of a semiconductor wafer. The region surrounded by vertical lines 51 and horizontal lines 52 on the figure is an area which can be exposed to light at one time in a single scanning operation (called "unit scan region"). FIG. 1B and FIG. 1C show enlarged plan views of the unit scan region. FIG. 1D is a cross-sectional view taken along the line 1D—1D of FIG. 1B. FIG. 1E is a cross sectional view taken along the line 1E—1E of FIG. 1C.

As shown in FIG. 1A, an edge exclusion line 54 is usually drawn inside an outer circumference 53 on the semiconductor wafer. The edge exclusion line 54 is used to divide between an effective element region (inside the line) and the "rounded off" peripheral edge portion (outside the line). Now, a case is assumed that a pattern drawn on a reticle is transferred onto the unit scan region (indicated by an open-circle ○ in FIG. 1A) including the rounded off peripheral region by scanning a unit light exposure region 55, as shown in FIGS. 1B and 1C.

When light is applied to an effective chip region alone (as shown in FIG. 1B), the light-exposure reference plane is obtained relatively flat as shown in FIG. 1D. Whereas, when light is applied to a region including an ineffective chip region (as shown in FIG. 1C), the light-exposure reference plane is inclined as shown in FIG. 1E. This is because the light-exposure reference plane is set so as to off set the "rounded off" surface of the peripheral portion. The term "effective chip region" used herein is an area for forming one chip, which is set within the effective element region, in which the ineffective element region (rounded off surface) is not included. The term "ineffective chip region" is a region for forming one chip, in which the ineffective element region (rounded off region) is included.

Since the ineffective chip region including the peripheral region and the effective chip region are present in the same light exposure unit area, the effective chip region is influenced by the "rounded off" peripheral portion. If the "rounded off" portion is large, a part of the effective chip region falls outside the depth of focus. As the result, the transferred pattern is blurred, providing defective elements. Accordingly, the number of chips having a good light exposure pattern (indicated by an open circle ○ in FIG. 1C) decreases. In the figure, reference symbol X indicates a chip having a defective light exposure pattern.

As described in the above, the conventional scan light exposure method to a semiconductor wafer has the following problems. Since the effective chip region belongs to the same light exposure unit as the ineffective chip region including a peripheral portion, the effective chip region is influenced by the rounded off surface. If the degree of the rounding off is large, a part of the effective chip region falls outside the depth of focus. The resultant pattern is blurred, producing defective elements.

BRIEF SUMMARY OF THE INVENTION

The present invention was made to solve the aforementioned problems. An object of the present invention is to provide a pattern exposure apparatus and method for a semiconductor wafer capable of reducing occurrence of a blurred pattern which is produced by the influence of an inevitably-formed rounded off portion of the peripheral edge portion of the wafer, during a circuit pattern is transferred to the semiconductor wafer.

To attain the aforementioned object, according to one aspect of the present invention, there is provided a pattern exposure apparatus for a semiconductor wafer comprising:

a light-exposure section for applying light to a predetermined region on a semiconductor wafer, the predetermined region including at least either one of or a part of both an effective element region and an ineffective element region, and the semiconductor wafer having the effective element region in which an element is formed and the ineffective element region in which no element is formed;

an unevenness measuring section for measuring unevenness of a surface of the semiconductor wafer at a plurality of sites within the predetermined region and outputting unevenness data;

a calculating section for obtaining a reference plane through calculation using unevenness data of the effective element region alone, after unevenness data of the ineffective element region is eliminated from the unevenness data output from the unevenness measuring section, the reference plane being used as a reference when light is applied to the predetermined region; and an inclination control mechanism for controlling inclination of the semiconductor wafer in accordance with the reference plane obtained through the calculation performed by the calculating section.

In the pattern exposure apparatus thus constructed, an evaluation process for determining the reference plane is performed in the predetermined region to be exposed at one time, by using the unevenness data of the effective element region alone without using unevenness data of the ineffective element region of the surface of the semiconductor wafer. In this manner, it is possible to reduce occurrence of a blurred pattern (which is formed due to the presence of the rounded-off peripheral portion of the semiconductor wafer) even if the semiconductor wafer does not have a flat surface, in particular, a rounded off peripheral portion is present in the edge portion of the semiconductor wafer.

According to a second aspect of the present invention, there is provided a pattern-exposure apparatus for a semiconductor wafer comprising:

a light-exposure section for applying light to a predetermined region on a semiconductor wafer, the predetermined region including at least either one of or a part of both an effective chip region and an ineffective chip region, the semiconductor wafer having the effective chip region and the ineffective chip region, the effective chip region being set within an effective element region in which an element is formed, and required for forming a single chip therein, and the ineffective chip region including an ineffective element region in which no element is formed and required for forming a single chip therein;

an unevenness measuring section for measuring unevenness of a surface of the semiconductor wafer at a plurality of sites within the predetermined region and outputting unevenness data;

a calculating section for obtaining a reference plane through calculation using unevenness data of the effective chip region alone, after unevenness data of the ineffective chip region is eliminated from the unevenness data output from the unevenness measuring section, said reference plane being used as a reference when light is applied to the predetermined region; and an inclination control mechanism for controlling inclination of the semiconductor wafer in accordance with the reference plane obtained through the calculation performed by the calculating section.

In the pattern exposure apparatus thus constructed, an evaluation process for determining the reference plane is performed in the predetermined region to be exposed at one time, by using the unevenness data of the effective element region alone without using unevenness data of the ineffective element region of the surface of the semiconductor wafer. In this manner, it is possible to reduce occurrence of a blurred pattern (which is formed due to the presence of the rounded-off peripheral portion of the semiconductor wafer) even if the semiconductor wafer does not have a flat surface, in particular, a rounded off peripheral portion is present in the edge portion of the semiconductor wafer.

According to a third aspect of the present invention, there is provided a pattern exposure method for a semiconductor wafer, comprising the steps of:

measuring degree of unevenness of a surface of the semiconductor wafer at a plurality of sites within a predetermined region on the semiconductor wafer and outputting unevenness data;

obtaining a reference plane for use in applying light to the predetermined region, through calculation using only unevenness data of an effective chip region of the unevenness data output, the effective chip region being within an effective element region in which an element is formed and required for forming a single chip; and controlling inclination of the semiconductor wafer in accordance with the reference plane obtained.

In the pattern exposure method thus constituted, an evaluation process for determining the reference plane is performed in the predetermined region to be exposed at one time, by using the unevenness data of the effective element region alone without using unevenness data of the ineffective element region of the surface of the semiconductor wafer. In this manner, it is possible to reduce occurrence of a blurred pattern (which is formed due to the presence of the rounded-off peripheral portion of the semiconductor wafer) even if the semiconductor wafer does not have a flat surface, in particular, a rounded off peripheral portion is present in the edge portion of the semiconductor wafer.

According to a fourth aspect of the present invention, there is provided a pattern exposure method for a semiconductor wafer comprising the steps of:

determining whether or not at least a part of an ineffective chip region is included in a predetermined region on the semiconductor wafer; the ineffective chip region including an ineffective element region in which no element is formed and required for forming a single chip;

measuring unevenness of a surface of the semiconductor wafer at a plurality of sites of the predetermined region excluding the ineffective chip region and outputting unevenness data;

obtaining a reference plane for use in applying light to the predetermined region, through calculation using the unevenness data output; and controlling inclination of the semiconductor wafer in accordance with the reference plane obtained.

In the pattern exposure method thus constituted, an evaluation process for determining the reference plane is performed in the predetermined region to be exposed at one time, by using the unevenness data of the effective element region alone without using unevenness data of the ineffective element region of the surface of the semiconductor wafer. In this manner, it is possible to reduce occurrence of a blurred pattern (which is formed due to the presence of the rounded-off peripheral portion of the semiconductor wafer) even if the semiconductor wafer does not have a flat surface, in particular, a rounded off peripheral portion is present in the edge portion of the semiconductor wafer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated at in and constitute a part of the specification, illustrate presently preferred embodiments of the invention, and together with the general description given above and the detailed description of the preferred embodiments given below, serve to explain the principles of the invention.

FIG. 1A is a plan view of a semiconductor wafer showing a unit light-exposure area (unit scan region) which can be exposed to light at one time in a single scanning operation by use of a conventional pattern exposure apparatus;

FIGS. 1B and 1C are enlarged plan views of the unit scan region;

FIG. 1D is a cross-sectional view taken along the line 1D—1D of FIG. 1B;

FIG. 1E is a cross-sectional view taken along the line 1E—1E of FIG. 1C;

DETAILED DESCRIPTION OF THE INVENTION

Now, embodiments of the present invention will be explained with reference to the accompanying drawings.

First, a pattern exposure apparatus according to an embodiment of the present invention will be explained. The pattern exposure apparatus is used for forming a circuit pattern on a semiconductor wafer by transferring the circuit pattern of a mask onto the semiconductor wafer.

Figure 2:
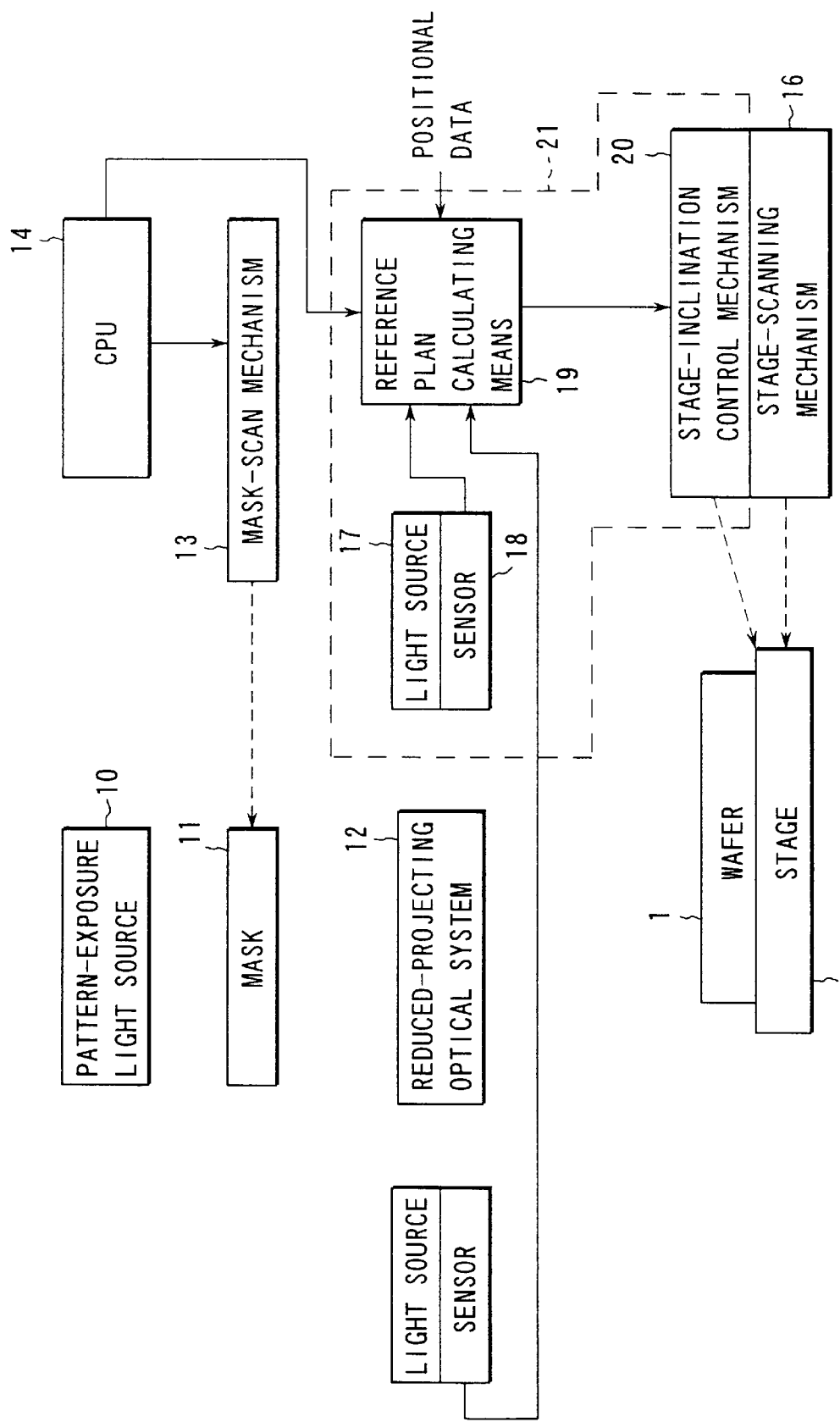
FIG. 2 is a block diagram showing a structure of a pattern exposure apparatus according to an embodiment of the present invention.

FIG. 2 is a block diagram showing a structure of the pattern exposure apparatus according to the embodiment of the present invention. The pattern exposure apparatus shown in FIG. 2 is a scan-type stepper apparatus.

As shown in FIG. 2, the scan-type stepper device has a light source 10, a mask 11, a reduced-image projecting optical system 12, a mask scan mechanism 13, a central process unit (CPU) 14, a stage 15, and a stage-scan mechanism 16. The light source 10 emits light for irradiating the pattern to be transferred. The mask (reticle) 11 is formed of a glass plate on which the pattern is drawn. The reduced-image projecting optical system 12 has a projection lens for reducing the pattern drawn on the mask 11 and projecting it. The mask scan mechanism 13 moves the mask 11 while scanning it. The central processing unit (CPU) 14 controls the entire light-exposure apparatus based on a program. A wafer is mounted on the stage 15. The stage 15 is moved by the stage scan mechanism in a scanning manner.

The scan-type stepper device has a leveling control means 21. The leveling control means 21 controls inclination of the wafer such that the largest value of the distances between uneven portions of the wafer surface (because the thickness of the wafer is not uniform) in the unit light exposure region and the light-exposure focus plane is minimized during the pattern exposure time. The leveling control means 21 is controlled by the CPU 14.

The leveling control means 21 has a laser light source 17, a sensor 18, a reference-plane calculation means 19, and a stage inclination control mechanism 20. Laser light is applied to the wafer 1 before the circuit pattern is projected onto the wafer 1. This is made in order to measure the distance between the mask 11 and a plurality of portions in each chip within the light-exposure region of the wafer 1. The sensor 18 receives reflected laser light which is applied to the wafer 1, and converts it into an electrical signal. The electrical signal is input into the reference plane calculating means 19. Since positional data of the reference plane on the wafer have been previously supplied to the reference plane calculating means 19, the electrical signal derived from the light reflected from the ineffective chip region is eliminated. Therefore, the reference plane calculating means 19 can determine the distance between the mask 11 (or the light-exposure focus plane) and a plurality of portions based on only the electrical signal derived from the light reflected from the effective chip region. As a result, the light-exposure reference plane is obtained through calculation using data of the distance. The inclination of the stage 15 (inclination of the wafer 1) and the height of the stage 15, if necessary, are controlled by the stage inclination control mechanism 20 on the basis of the light-exposure reference plane determined by the reference plane calculating means 19.

The leveling control means 21 is operated as follows.

Before the circuit pattern is transferred to the semiconductor wafer 1, laser light is applied to the wafer 1 from the laser light source 17 in order to measure the distance between the mask 11 and a plurality of portions in each chip within the unit light-exposure region of the wafer 1. The laser light is then reflected from the wafer 1, received by a plurality of sensors 18, and converted into an electrical signal. The electrical signal is sent to the CPU 14.

The CPU 14 has a reference plane calculating means 19 using, for example, a program. The CPU 14 determines whether at least a part of the ineffective chip region is included or not in the unit light-exposure region on the basis of the positional data previously supplied. The ineffective chip region is a region required for forming a single chip and including a peripheral portion of the wafer edge (the ineffective element region). When the ineffective chip region is included, the CPU 14 does not select the sensors 18 corresponding to the ineffective chip region but selects only the sensors 18 corresponding to the effective chip region 18. On the other hand, when the ineffective chip region is not included, the CPU 14 selects all sensors 18. The distance is determined by processing the output signals derived from the selected sensors 18 by the CPU. The results of the distance thus determined are sent to the reference plane calculating means 19.

The light-exposure reference plane is determined by the reference plane calculating means 19 through calculation using the distance data. The inclination and, if necessary, the height of the stage 15 are controlled by the stage inclination control mechanism 20 on the basis of the obtained light-exposure reference plane.

More specifically, the leveling control means 21 controls the inclination of the wafer 1 such that the light-exposure reference plane matches with the light focus plane.

Then, how to control the inclination of the wafer 1 by the leveling control means 21, will be explained with reference to the flow chart.

Figure 3:
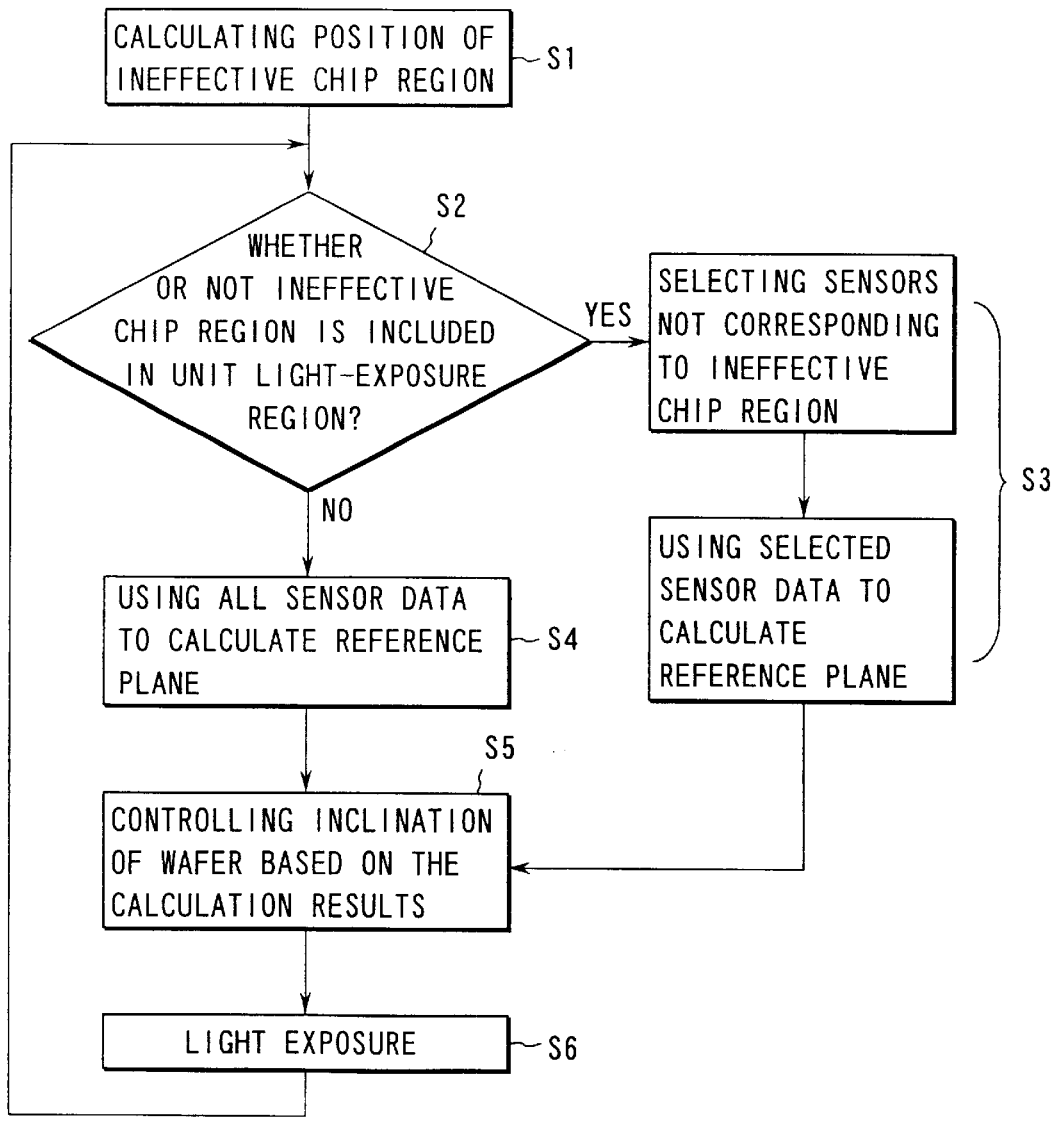
FIG. 3 is a flow chart showing the steps for how to tile the semiconductor wafer in the pattern exposure apparatus of the embodiment.

The flow chart of FIG. 3 shows the flow of the operation for controlling the inclination of the wafer 1 by the leveling control means 21 (FIG. 2).

In the step S1, the ineffective chip region, that is, the ineffective element region including the "rounded off" portion is first determined by using a wafer size and a chip size as a base, in each of the chips arranged in the wafer 1.

In the step S2, it is determined whether or not at least a part of the ineffective chip region is included in the unit light exposure region when the circuit pattern is projected onto the wafer 1. As a result, if the ineffective chip region is included even partly (YES), the flow goes to the step 3. In the step 3, the sensors 18 not corresponding to the ineffective chip region are selected. In other words, the sensors only corresponding to the effective chip region are selected. The output signals from the selected sensors 18 are processed to measure the distances to the surface of the wafer. Through the calculation, the light-exposure reference plane is obtained. The light exposure reference plane is set on the wafer such that each of the distances is minimized.

In the step S5, the inclination of the wafer 1 is controlled by the stage inclination control mechanism 20 on the bases of the light-exposure reference plane thus calculated. In the step S6, light is applied to transfer the circuit pattern of the mask 11 onto the wafer 1. After the scanning operation is completed, the flow goes back to the step S2.

In the step S2, if the ineffective chip region is not included even partly(NO), all sensors 18 are selected in the step S4. The distances to the surface of the wafer are measured by processing the output signals from the sensors 18 selected. After calculation, the light-exposure reference plane is obtained. The light exposure reference plane is set on the wafer such that each of the distances is minimized. Thereafter, the flow goes to step S5.

As described above, inclination of the wafer is controlled and the circuit-pattern is transferred in every unit light exposure region on the wafer 1, while changing the unit light exposure region sequentially.

Now, the case where the circuit pattern is transferred to a region including a peripheral portion of the semiconductor wafer edge by use of the pattern exposure apparatus (FIG. 2) will be explained with reference to FIGS. 4A to 4E, and the flow chart of FIG. 3.

Figure 4A:
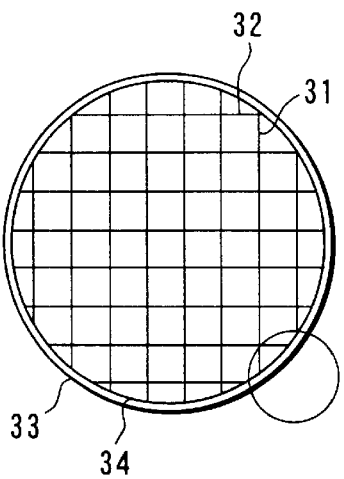
FIG. 4A is a plan view of a semiconductor wafer showing a region (unit scan region) which can be exposed to light at one time in a single scanning operation by use of a pattern exposure apparatus of the embodiment.
Figure 4B:
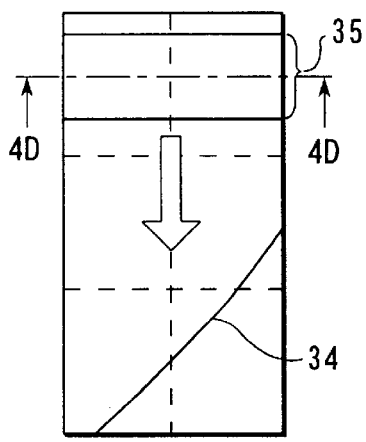
FIGS. 4B and 4C are enlarged plan view of the unit scan region.
Figure 4C:
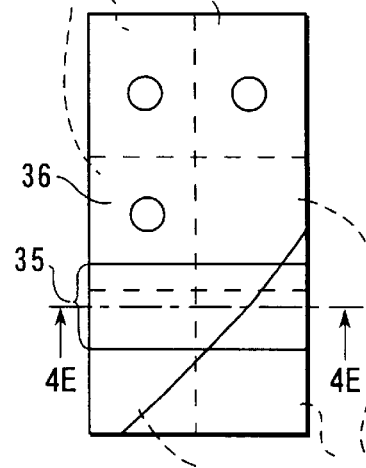
Figure 4D:
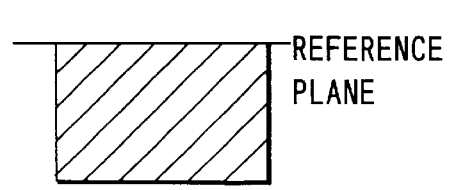
FIG. 4D is a cross-sectional view taken along the line 4D—4D of FIG. 4B.
Figure 4E:
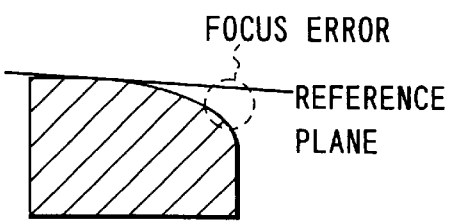
FIG. 4E is a cross-sectional view taken along the line 4E—4E of FIG. 4C.

FIG. 4A is a plan view of a semiconductor wafer. In the figure, the area surrounded by vertical lines 31 and horizontal lines 32 is called a unit scan region which is exposed to light at one time. FIG. 4B and FIG. 4C are enlarged plan views of the unit scan region. FIG. 4D is a cross-sectional view taken along the line 4D—4D of FIG. 4B. FIG. 4E is a cross-sectional view taken along the line 4E—4E of FIG. 4C. FIG. 4D and FIG. 4E show conceptual views of the light-exposure reference plane.

Generally, an edge exclusion line 34 is drawn inside an outer circumference line 33 on the semiconductor wafer, as shown in FIG. 4A. The edge exclusion line 34 divides between an effective element region (inside the line) and the "rounded off" peripheral edge portion (outside the line). Now, a case is assumed that a pattern drawn on a reticle is transferred onto the unit scan region (indicated by an open-circle ○ in FIG. 4A) including the rounded off peripheral region by scanning a unit light exposure region 35, as shown in FIGS. 4B and 4C.

In the first place, a semiconductor wafer to be exposed to light was formed by picking up single crystalline silicon by a Czochralski method. The single crystalline silicon was sliced, wrapped, etched and polished. As a result, 200 wafers were obtained which had a predetermined diameter of 200 mm (8 inches) and a predetermined thickness of 725 $\mu$m. One side surface of each of these wafers was a mirror surface and an opposite surface was an etched surface.

Then, the unit light exposure area was set at 8 mm (Y-direction)×25 mm (X-direction). A pattern in which wiring elements of 0.20 $\mu$m wide were arranged at 0.4 $\mu$m intervals (pitch), was transferred onto the mirror surface of the wafer, by using the scan-type light exposure stepper capable of applying light to the unit scan region (called one cell) of 32 mm (Y-direction)×25 mm (X-direction). In this case, the unit light exposure region 35 was 8 mm×24 mm. While the leveling control was performed by use of the leveling control means, a region of 32 mm (Y-direction)×24 mm (X-direction) was shot at one time. As a result, chips were sequentially exposed to light in a scanning manner to form elements of 12 mm×10.5 mm. In this case, 6 chips in sum (two chips in the X-direction and three chips in the Y-direction) per cell, were obtained.

Of 200 wafers, a pattern was formed on 100 wafers in accordance with a conventional pattern exposure method using a conventional scan light exposure stepper. The remainder 100 wafers were pattern-exposed by the pattern exposure method of the present invent using the scan light-exposure stepper of the present invention.

In the pattern exposure method of the present invention, the light exposure focus plane is determined in accordance with the procedure shown in FIG. 3, more specifically, by tilting the wafer such that the largest value of the distances between uneven portions of the wafer surface and the light exposure focus plane is minimized in the effective chip region within the unit light exposure region.

When light is applied to the effective chip region alone as shown in FIG. 4B, the light-exposure reference plane is formed relatively flat, as shown in FIG. 4D. On the other hand, when light is exposed to the region including the ineffective chip region, if operation is performed in accordance with the steps of the flow-chart shown in FIG. 3, the light-exposure reference plane can be controlled in a relatively flat state, as shown in FIG. 4E. This is because the effective chip region 36 (see FIG. 4C), which belongs to the same light-exposure unit as the peripheral portion of the wafer edge, is free from the effect of the rounded off portion of the peripheral portion.

When the method of the present invention was employed, an evaluation process for determining the light-exposure focus plane was performed within the effective chip region. To be more specific, the ineffective chip region was not included in this evaluation process. Therefore, even if the rounded off portion was present in the peripheral portion of the wafer and thereby the degree of flatness of the wafer was decreased, the leveling control was performed without influence of the rounded off portion. The light-exposure reference portion was therefore not inclined. Actually, no defective patterns were obtained in the effective element region even immediately inside the ineffective element region.

In contrast, when the conventional pattern-exposure method was used, the defective pattern was obtained in the effective element region immediately inside the ineffective element region. This is because leveling control was applied to the peripheral portion of the light exposure region including the rounded off portion. The light-exposure reference plane inclines by the effect of the rounded off region, with the result that a defocus portion is produced in the effective element region immediately inside the ineffective element region.

As explained in the above, according to the light-exposure apparatus and method for a semiconductor wafer, even if the degree of the flatness of the wafer is poor since the rounded off portion is produced in the ineffective element region of the peripheral edge of the wafer during the wafer surface polishing step, only the effective chip region is subjected to the evaluation process for determining the light-exposure reference plane. The peripheral ineffective chip region is not subjected to the evaluation process. Since the rounded off portion has no effect upon the evaluation process, an inclined light-exposure reference portion is not obtained. As a result, no defective patterns due to focus error are obtained in the effective element region even immediately inside the ineffective element region.

Accordingly, if pattern exposure is performed in accordance with the pattern exposure apparatus and method of the present invention, it is possible to reduce defects of the resultant semiconductor devices. Hence, highly-reliable semiconductor devices can be manufactured in a high yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern exposure apparatus for a semiconductor wafer comprising:

a light exposures section applying light to a predetermined region on a semiconductor wafer having an effective element region, in which an element is formed, and an ineffective element region, in which no element is formed, said predetermined region including at least either one of or a part of both the effective element region and the ineffective element region;

a determination section determining that each of a plurality of sites within the predetermined region is either the effective element region or the ineffective element region;

an unevenness measuring section measuring unevenness of sites only having the effective element region, which are selected from said plurality of sites within the predetermined region by eliminating sites having the ineffective element region determined by said determination section, and outputting unevenness data;

a calculating section obtaining a reference plane through calculation using unevenness data output from the unevenness measuring section, said reference plane being used as a reference when light is applied to the predetermined region by said light exposures section; and an inclination control mechanism controlling inclination of the semiconductor wafer in accordance with the reference plane obtained through the calculation performed by the calculating section.

2. The pattern-exposure apparatus according to claim 1, wherein the reference plane is obtained through calculation performed by the calculating section such that a maximum degree of the unevenness of the surface of the semiconductor wafer within the effective element region of the predetermined region is minimized.

3. The pattern-exposure apparatus according to claim 1, wherein said unevenness measuring section has a light source for applying light and a sensor for receiving light and outputting an electrical signal, and said unevenness measuring section measures a distance from the wafer by applying light to the semiconductor wafer from the light source and receiving light reflected from a surface of the semiconductor wafer by the sensor and outputs the unevenness data.

4. The pattern-exposure apparatus according to claim 1, wherein said light-exposure section has a light source for applying light and a mask having a circuit pattern drawn thereon, and said light exposure section transfers the circuit pattern drawn on the mask onto the semiconductor wafer by use of light applied from the light source.

5. The pattern-exposure apparatus according to claim 1, further comprising a stage for mounting the semiconductor wafer thereon, wherein the inclination control mechanism controls inclination of the semiconductor wafer by controlling inclination of the stage.

6. The pattern-exposure apparatus according to claim 4, further comprising a mask scan mechanism for scanning the mask, a stage for mounting the semiconductor wafer thereon, and a stage scan mechanism for scanning the stage, wherein the circuit pattern on the mask is transferred onto the semiconductor wafer by synchronously scanning the mask and the stage by the mask scan mechanism and the stage scan mechanism, respectively.

7. A pattern-exposure apparatus for a semiconductor wafer comprising:
  a light-exposure section applying light to a predetermined region on a semiconductor wafer having an effective chip region and an ineffective chip region, said effective chip region being set within an effective element region, in which an element is formed, and required for forming a single chip therein, said ineffective chip region including an ineffective element region, in which no element is formed and required for forming a single chip therein, and said predetermined region including at least either one of or a part of both the effective chip region and the ineffective chip region;
  a determination section determining that each of a plurality of sites within the predetermined region is either the effective element region or the ineffective element region;
  an unevenness measuring section measuring unevenness of sites only having the effective chip region, which are selected from said plurality of sites within the predetermined region by eliminating sites having the ineffective chip region determined by said determination section and outputting unevenness data;
  a calculating section obtaining a reference plane through calculation using unevenness data output from the unevenness measuring section, said reference plane being used as a reference when light is applied to the predetermined region by said light exposures section; and
  an inclination control mechanism controlling inclination of the semiconductor wafer in accordance with the reference plane obtained through the calculation performed by the calculating section.

8. The pattern-exposure apparatus according to claim 7, wherein the reference plane is obtained through calculation performed by the calculating section such that a maximum degree of the unevenness of the surface of the semiconductor wafer within the effective element region of the predetermined region is minimized.

9. The pattern-exposure apparatus according to claim 7, wherein said unevenness measuring section has a light source for applying light and a sensor for receiving light and outputting an electrical signal, and said unevenness measuring section measures a distance from the wafer by applying light to the semiconductor wafer from the light source and receiving light reflected from a surface of the semiconductor wafer by the sensor and outputs the unevenness data.

10. The pattern-exposure apparatus according to claim 7, wherein said light-exposure section has a light source for applying light and a mask having a circuit pattern drawn thereon, and said light exposure section transfers the circuit pattern drawn on the mask onto the semiconductor wafer by use of light applied from the light source.

11. The pattern-exposure apparatus according to claim 7, further comprising a stage for mounting the semiconductor wafer thereon, wherein the inclination control mechanism controls inclination of the semiconductor wafer by controlling inclination of the stage.

12. The pattern-exposure apparatus according to claim 10, further comprising a mask scan mechanism for scanning the mask, a stage for mounting the semiconductor wafer thereon, and a stage scan mechanism for scanning the stage, wherein the circuit pattern on the mask is transferred onto the semiconductor wafer by synchronously scanning the mask and the stage by the mask scan mechanism and the stage scan mechanism, respectively.

13. A pattern exposure method for a semiconductor wafer comprising the steps of:
  determining whether or not at least a part of an ineffective chip region is included in a predetermined region on the semiconductor wafer; said ineffective chip region including an ineffective element region in which no element is formed and required for forming a single chip;
  measuring unevenness of a surface of the semiconductor wafer at a plurality of sites of the predetermined region excluding the ineffective chip region and outputting unevenness data;
  obtaining a reference plane for use in applying light to the predetermined region, through calculation using the unevenness data output; and
  controlling inclination of the semiconductor wafer in accordance with the reference plane obtained.

14. The pattern-exposure method according to claim 13, wherein the reference plane is obtained through calculation performed such that a maximum degree of the unevenness of the surface of the semiconductor wafer within the effective chip region of the predetermined region is minimized.

15. The pattern-exposure method according to claim 13, wherein the unevenness data is obtained by measuring a distance from the wafer to a light source by applying light to the semiconductor wafer from the light source and receiving light reflected from a surface of the semiconductor wafer by a sensor.

16. The pattern-exposure method according to claim 13, wherein further comprising a step of applying light to the predetermined region so as to match a light-exposure focusing surface with the reference plane after the step of controlling inclination of the semiconductor wafer.

* * * * *